United States Patent
Kim et al.

(10) Patent No.: US 9,178,024 B2
(45) Date of Patent: Nov. 3, 2015

(54) THIN FILM TRANSISTOR DISPLAY PANEL AND MANUFACTURING METHOD THEREOF

(75) Inventors: Ki-Won Kim, Suwon-si (KR); Kap Soo Yoon, Seoul (KR); Woo Geun Lee, Yongin-si (KR); Jin-Won Lee, Cheonan-si (KR); Se-Myung Kwon, Seongnam-si (KR); Jung Ouck Ahn, Yangyang-gun (KR); Si Jin Kim, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 13/464,613

(22) Filed: May 4, 2012

(65) Prior Publication Data

US 2013/0146864 A1    Jun. 13, 2013

(30) Foreign Application Priority Data

Dec. 12, 2011    (KR) .................. 10-2011-0132994

(51) Int. Cl.
| | |
|---|---|
| H01L 21/00 | (2006.01) |
| H01L 29/417 | (2006.01) |
| H01L 29/66 | (2006.01) |
| H01L 27/12 | (2006.01) |
| H01L 29/786 | (2006.01) |

(52) U.S. Cl.
CPC ...... *H01L 29/41733* (2013.01); *H01L 27/1225* (2013.01); *H01L 27/1259* (2013.01); *H01L 29/66765* (2013.01); *H01L 29/78696* (2013.01)

(58) Field of Classification Search
CPC .................. H01L 27/1214; H01L 29/66765
USPC .............. 438/104, 734, 745, 754, 749–751; 257/43
See application file for complete search history.

(56) References Cited

U.S. PATENT DOCUMENTS

| | | | |
|---|---|---|---|
| 6,259,502 B1 * | 7/2001 | Komatsu | 349/141 |
| 6,590,623 B2 | 7/2003 | Ono et al. | |
| 6,825,497 B2 * | 11/2004 | Lai | 257/72 |
| 7,385,355 B2 * | 6/2008 | Kusunoki et al. | 315/169.1 |
| 7,480,015 B2 | 1/2009 | Kim et al. | |
| 7,728,334 B2 * | 6/2010 | Yamazaki et al. | 257/72 |

(Continued)

FOREIGN PATENT DOCUMENTS

| | | |
|---|---|---|
| JP | 2002-350899 | 12/2002 |
| JP | 2005-283689 | 10/2005 |

(Continued)

*Primary Examiner* — Thao X Le
*Assistant Examiner* — Gardner W Swan
(74) *Attorney, Agent, or Firm* — H.C. Park & Associates, PLC

(57) ABSTRACT

A method for manufacturing a thin film transistor array panel includes forming a gate line and a gate electrode protruding from the gate line on a substrate; forming a gate insulating layer on the gate line and the gate electrode; depositing sequentially a semiconductor material and a metal material on the gate insulating layer; performing a first etching operation on the semiconductor material and the metal material using a first mask to form a semiconductor layer and a metal layer, the metal layer including a data line, a source electrode, and a drain electrode, in which the drain electrode protrudes from the data line, and the source electrode and the drain electrode having an integral shape; and performing a second etching operation on the metal layer using a second mask to divide the source electrode and the drain electrode.

17 Claims, 18 Drawing Sheets

(56) References Cited

U.S. PATENT DOCUMENTS

| | | | |
|---|---|---|---|
| 8,168,544 B2 * | 5/2012 | Chang | 438/754 |
| 8,338,240 B2 * | 12/2012 | Toriumi et al. | 438/162 |
| 2006/0180814 A1 * | 8/2006 | Kim | 257/59 |
| 2006/0214160 A1 * | 9/2006 | Furukawa et al. | 257/40 |
| 2008/0042134 A1 * | 2/2008 | Jung et al. | 257/59 |
| 2009/0294781 A1 | 12/2009 | Kim et al. | |
| 2011/0042668 A1 * | 2/2011 | Hama et al. | 257/43 |
| 2011/0069247 A1 | 3/2011 | Zhou et al. | |
| 2011/0136302 A1 * | 6/2011 | Yamazaki et al. | 438/156 |
| 2011/0233550 A1 * | 9/2011 | Takasawa et al. | 257/57 |
| 2013/0092923 A1 * | 4/2013 | Hara et al. | 257/43 |

FOREIGN PATENT DOCUMENTS

| | | | | |
|---|---|---|---|---|
| KR | 10-0811997 | | 3/2008 | |
| KR | 10-0864209 | | 9/2008 | |
| KR | 10-2010-0055127 | | 5/2010 | |
| KR | 10-1051586 | | 12/2010 | |
| KR | 10-2011-0061773 | | 6/2011 | |
| KR | 10-2011-0070445 | | 6/2011 | |
| KR | 10-2011-0093113 | | 5/2012 | |
| WO | WO 2011/086905 | * | 7/2011 | H01L 29/786 |

* cited by examiner

THIN FILM TRANSISTOR DISPLAY PANEL AND MANUFACTURING METHOD THEREOF

CROSS-REFERENCE TO RELATED APPLICATION

This application claims priority to and the benefit of Korean Patent Application No. 10-2011-0132994, filed on Dec. 12, 2011, the entire contents of which are incorporated herein by reference.

BACKGROUND

1. Field

The following description relates to a thin film transistor array panel and a manufacturing method thereof. More particularly, the description relates to a thin film transistor array panel and a manufacturing method for reducing skew formed during an etching process.

2. Discussion of the Background

A thin film transistor is used as a switching element to independently drive each pixel in a flat display device, such as a liquid crystal display or an organic light emitting device. The thin film transistor array panel including a thin film transistor may include a scanning signal line (or a gate line) to transmit a scanning signal to the thin film transistor and a data line that transmits a data signal, as well as a pixel electrode connected to the thin film transistor.

The thin film transistor may include a gate electrode that is connected to the gate line, a source electrode that is connected to the data line, a drain electrode that is connected to the pixel electrode, and a semiconductor layer. The semiconductor layer may be disposed on the gate electrode, which may be disposed between the source electrode and drain electrode. The data signal may be transmitted to the pixel electrode from the data line according to the gate signal from the gate line.

The semiconductor layer of the thin film transistor may be made of, without limitation, amorphous silicon, polysilicon (polycrystalline silicon), and a metal oxide.

Recently, an oxide semiconductor using a metal oxide having a lower cost and higher uniformity compared with polycrystalline silicon, as well as having a higher charge mobility and a higher ON/OFF ratio of a current compared with amorphous silicon has been researched.

If forming the oxide semiconductor of the semiconductor layer, the source electrode and the drain electrode may be formed by using a metal such as titanium (Ti) and copper (Cu).

If etching process is performed on an oxide semiconductor formed of titanium or copper by using a dry etching method, the etching rate may be below a reference threshold, such that a wet etching method may be used. Also, if etching process is performed on other materials other than the above described materials, the dry etching method may not be used in lieu of the wet etching to reduce its cost of operation.

If wet etching method is used in the etching process, isotropic etching may be performed, such that an etchant may penetrate into the metal layer positioned under a photosensitive film or a mask, and thereby a skew and/or an under-cut may be generated on side surfaces of the metal layer. Further, the etching process may not penetrate a semiconductor layer or any other layer disposed below the metal layer, such that boundaries the semiconductor layer protrudes beyond the skewed metal layer. In an example, the boundaries or ends of the semiconductor layer may protrude at least 0.5 um beyond the metal layer boundary. The protruded ends of the semiconductor layer may decrease the size of a design area, which may affect resolution quality of the display.

In a conventional 4-mask process, an etch-back process may be used to form the semiconductor layer, the source electrode, and the drain electrode using one mask. In the etch-back process, the photosensitive film may be etched such that a portion of the photosensitive film may be etched to provide a cavity or a channel portion in the photosensitive film to expose a portion of a layer including the source electrode and the drain electrode. In an example, etch back process may be performed on the photosensitive film with differing heights, such that the lower portion may be etched away to expose a portion of the metal layer while higher portions of the photosensitive film remains.

Accordingly, a boundary of the semiconductor layer and the boundary of the layer including the source electrode and the drain electrode may not correspond to each other. More specifically, edges of the layer including the source electrode and the drain electrode may be skewed, so that the semiconductor layer protrudes beyond the boundary of the layer including the source electrode and the drain electrode. However, the portion where the semiconductor layer that is protruded from the source electrode and the drain electrode may be unnecessary, and may cause a problem that a design margin must be increased.

The above information disclosed in this background section is only for enhancement of understanding of this disclosure and therefore it may contain information that does not form the prior art that is already known in this country to a person of ordinary skill in the art.

SUMMARY

Exemplary embodiments of the present invention provide a thin film transistor array panel and a manufacturing method thereof.

Additional features of the invention will be set forth in the description which follows, and in part will be apparent from the description, or may be learned by practice of the invention.

Exemplary embodiments of the present invention provide a thin film transistor array panel including a substrate; a gate line disposed on the substrate; a gate electrode protruded from the gate line; a gate insulating layer disposed on the gate line and the gate electrode; a semiconductor layer disposed on the gate insulating layer; a metal layer disposed on the semiconductor layer, the metal layer including a data line, a source electrode protruded from the data line, the source electrode disposed on the gate electrode, a drain electrode spaced apart from the source electrode, the drain electrode disposed on the gate electrode; and a pixel electrode connected to the drain electrode, in which an edge of the semiconductor layer protrudes less than 0.5 um beyond an end of the first layer, and the semiconductor layer includes a channel portion disposed between the source electrode and the drain electrode.

Exemplary embodiments of the present invention provide a method for manufacturing a thin film transistor array panel including forming a gate line and a gate electrode protruding from the gate line on a substrate; forming a gate insulating layer on the gate line and the gate electrode; depositing sequentially a semiconductor material and a metal material on the gate insulating layer; performing a first etching operation on the semiconductor material and the metal material using a first mask to form a semiconductor layer and a metal layer, the metal layer including a data line, a source electrode, and a drain electrode, in which the drain electrode protrudes from the data line, the source electrode is formed on the gate electrode, the source electrode and the drain electrode having an integral shape, and the semiconductor layer positioned under the metal layer; performing a second etching operation on the metal layer using a second mask to divide the source electrode and the drain electrode; and forming a pixel electrode connected to the drain electrode.

Exemplary embodiments of the present invention provide a method for manufacturing a thin film transistor array panel including forming a gate line and a gate electrode protruding from the gate line on a substrate; forming a gate insulating layer on the gate line and the gate electrode; depositing sequentially a semiconductor material and a metal material on the gate insulating layer; executing a first etching operation for etching the metal material using a first mask to remove a portion of the metal material overlapping the gate electrode and exposing a portion of the semiconductor layer; executing a second etching operation for etching the semiconductor material and the metal material using a second mask to form a semiconductor layer and a metal layer including a data line, a source electrode overlapping the gate electrode and protruding from the data line, and a drain electrode, in which the drain electrode is spaced apart from the source electrode, and the semiconductor layer is positioned under the metal layer; and forming a pixel electrode connected to the drain electrode.

It is to be understood that both the foregoing general description and the following detailed description are exemplary and explanatory and are intended to provide further explanation of the invention as claimed. Other features and aspects will be apparent from the following detailed description, the drawings, and the claims.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION OF THE ILLUSTRATED EMBODIMENTS

Figure 1:
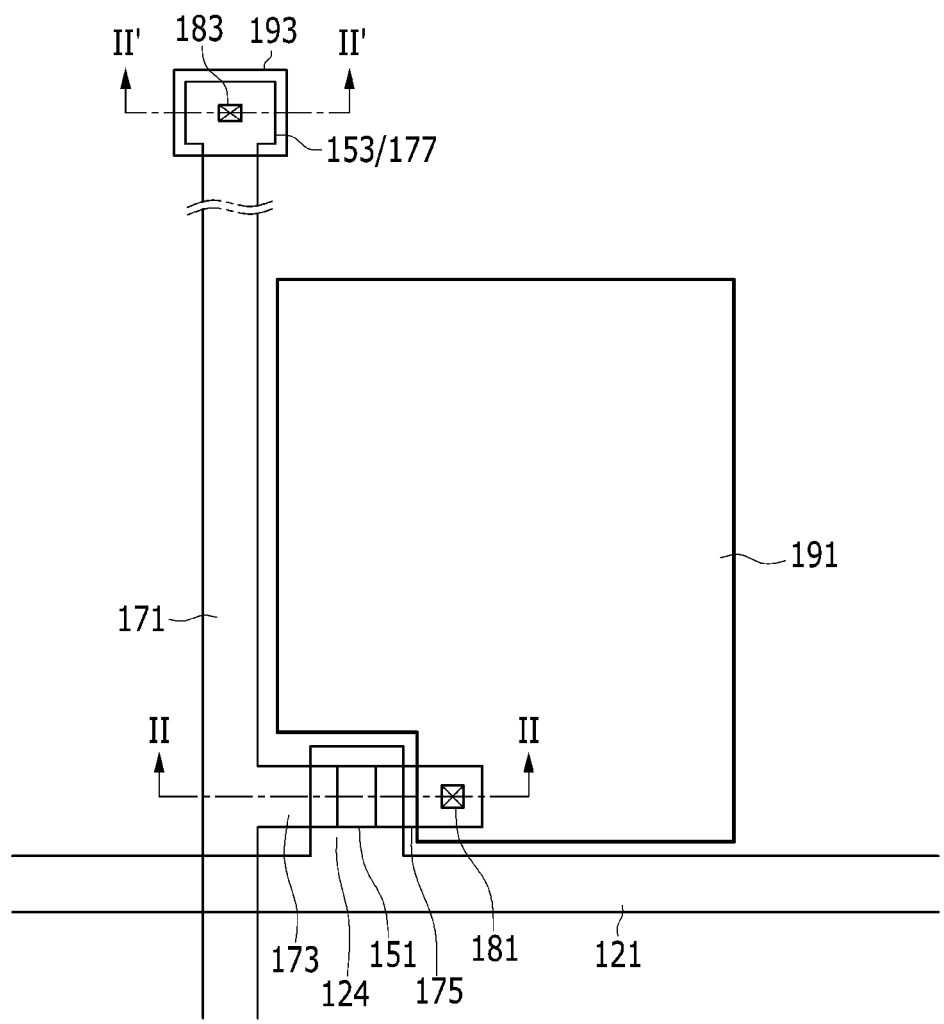
FIG. 1 is a top plan view of a pixel of a thin film transistor array panel according to an exemplary embodiment of the present invention.

The invention will be described more fully hereinafter with reference to the accompanying drawings, in which exemplary embodiments of the invention are shown. As those skilled in the art would realize, the described embodiments may be modified in various different ways without departing from the spirit or scope of the invention.

In the drawings, the thickness of layers, films, panels, regions, etc., are exaggerated for clarity. Like reference numerals designate like elements throughout the specification. It will be understood that for the purposes of this disclosure, "at least one of X, Y, and Z" can be construed as X only, Y only, Z only, or any combination of two or more items X, Y, and Z (e.g., XYZ, XZ, XYY, YZ, ZZ). Further, it will be understood that when an element such as a layer, film, region, or substrate is referred to as being "on" another element, it can be directly on the other element or intervening elements may also be present. In contrast, when an element is referred to as being "directly on" another element, there are no intervening elements present.

A thin film transistor array panel according to exemplary embodiments of the invention will be described with reference to accompanying drawings.

Figure 2:
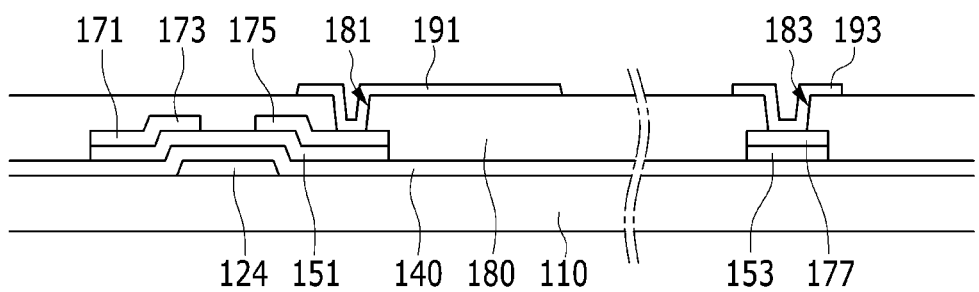
FIG. 2 is a cross-sectional view taken along the lines II-II and II'-II' of FIG. 1.

FIG. 1 is a top plan view of a pixel of a thin film transistor array panel according to an exemplary embodiment of the present invention, and FIG. 2 is a cross-sectional view taken along the lines II-II and II'-II' of FIG. 1.

Referring to FIG. 1, in a thin film transistor array panel, a gate line 121 is formed in one direction on a substrate 110, which may be made of a material such as glass or plastic, and a gate electrode 124 protruded from the gate line 121 is formed. The gate electrode 124 is connected to the gate line 121 and a gate signal may be applied through the gate line 121.

A gate insulating layer 140 is formed on the whole surface of the substrate 110 including the gate line 121 and the gate electrode 124. The gate insulating layer 140 may be made of an insulating material, such as silicon nitride (SiNx) or silicon oxide (SiOx), or a dual layer of SiNx and SiOx.

A semiconductor layer 151 is formed on the gate insulating layer 140. The semiconductor layer 151 may be made of an amorphous silicon semiconductor, a polysilicon semiconductor, an oxide semiconductor, and the like. If the semiconductor layer 151 is made of the oxide semiconductor, materials including indium-gallium-zinc oxide (IGZO), zinc-tin oxide (ZTO), and indium-tin oxide (IZO) may be used.

A data line 171 is formed in the other direction on the semiconductor layer 151, and a source electrode 173 protruded from the data line 171 on the gate electrode 124 and a drain electrode 175 separated from the source electrode 173 are formed.

The source electrode 173 and the drain electrode 175 are separated from each other on the gate electrode 124. The semiconductor layer 151 includes a channel portion corresponding to a separated portion between the source electrode 173 and the drain electrode 175. A current may flow through the channel portion.

The semiconductor layer 151 wholly overlaps a metal layer including the data line 171, the source electrode 173, and the drain electrode 175 except for the channel portion to have the same boundary.

Conventionally, a structure in which the semiconductor layer 151 overlaps the metal layer including the data line 171, the source electrode 173, and the drain electrode 175 is provided. However, in this case, the semiconductor layer 151 has the boundary or an end portion positioned outside the boundary of the metal layer. That is, from a top view of the upper surface of the substrate 110, the semiconductor layer 151 protrudes beyond the boundary or end portion of the metal layer. In an example, the semiconductor layer 151 may protrude at least 0.5 um beyond the boundary or end portion of the data line 171.

Differently from this, in the thin film transistor array panel according to an exemplary embodiment of the present invention, the semiconductor layer 151 may not be formed to be protruded beyond the boundary or end portion of the metal layer. However, in the reference tolerance or an error range, the semiconductor layer 151 may be formed to be protruded outside or inside of the boundary of the metal layer. That is, except for deviations within the reference tolerance range or the error range, the boundary of the semiconductor layer 151 and the boundary of the metal layer may overlap as a whole with the exception of the channel portion. For example, the reference tolerance range or the error range may be less than 0.5 um, and may be smaller than 0.1 um. A difference between the boundary of the semiconductor layer 151 and the boundary of the data line 171, the source electrode 173, and the drain electrode 175 may be less than 0.5 um.

The metal layer including the data line 171, the source electrode 173, and the drain electrode 175 may have a multi-layer composition, such as a dual layer or a triple layer. That is, the metal layer may be deposited in several layers and patterned to form the data line 171, the source electrode 173, and the drain electrode 175.

For example, if the data line 171, the source electrode 173, and the drain electrode 175 are made of the dual layer including the lower layer and the upper layer, the lower layer may be made of titanium (Ti) and the upper layer may be made of copper (Cu). In another example, the lower layer may be made of a copper-manganese (Cu—Mn) alloy, and the upper layer may be made of copper (Cu).

Further, the data line 171, the source electrode 173, and the drain electrode 175 may be made to have a triple layer composition including a lower layer, a middle layer, and an upper layer. In this case, for example, the lower layer and the upper layer may be made of molybdenum (Mo), and the middle layer may be made of aluminum (Al).

A passivation layer 180 is formed on the data line 171, the source electrode 173, and the drain electrode 175. The passivation layer 180 may be made of an inorganic insulating material or an organic insulating material, or may have a dual layer composition including a layer of an inorganic insulating material and a layer of an organic insulating material. If the semiconductor layer 151 is made of the oxide semiconductor, it may be the passivation layer 180 of the portion contacting the semiconductor layer 151 may be formed of silicon oxide.

The passivation layer 180 has a first contact hole 181 exposing a portion of the drain electrode 175.

A pixel electrode 191 connected to the drain electrode 175 through the first contact hole 181 is formed on the passivation layer 180. The pixel electrode 191 may be made of a transparent metal material, such as indium-tin oxide (ITO) and indium-zinc oxide (IZO).

In the thin film transistor array panel according to an exemplary embodiment of the present invention, the gate line 121 and the data line 171 may be crossed, and a data pad electrode 177 having a wider width than the width of the data line 171 may be formed at an end of the data line 171. The data pad electrode 177 is extended from the data line 171 and may be formed with the same material as the data line 171.

A semiconductor pattern 153 made of the same material as the semiconductor layer 151 is formed under the data pad electrode 177. The semiconductor pattern 153 has a wider width than the data line 171 and has the same width as the data pad electrode 177. The semiconductor pattern 153 overlaps to have the same boundary as the data pad electrode 177.

The passivation layer 180 may have a second contact hole 183 exposing a portion of data pad electrode 177.

A connection electrode 193 connected to the data pad electrode 177 through the second contact hole 183 may be formed on the passivation layer 180. The connection electrode 193 may be formed with the same material as the pixel electrode 191. The connection electrode 193 may be connected to a data driving circuit, which may be used to receive and supply a data signal to the data line 171.

Next, a manufacturing method for a thin film transistor array panel according to an exemplary embodiment of the present invention will be described with accompanying drawings.

FIG. 3, FIG. 4, FIG. 5, FIG. 7, FIG. 8, FIG. 10, FIG. 11, and FIG. 12 are cross-sectional views of a thin film transistor array panel according to an exemplary embodiment of the present invention. FIG. 6A and FIG. 6B are enlarged cross-sectional views showing regions A1 and A2 of the thin film transistor array panel shown in FIG. 5. FIG. 9A and FIG. 9B are enlarged cross-sectional views showing regions B1 and B2 of the thin film transistor array panel shown in FIG. 8.

Figure 3:
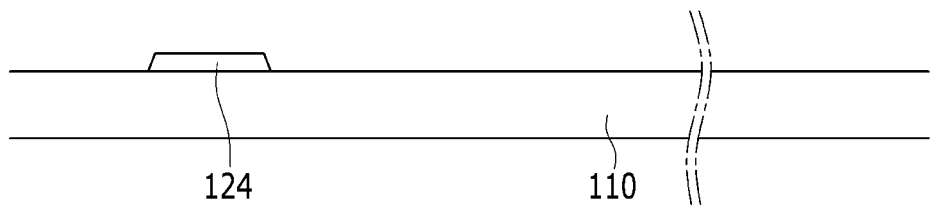
FIG. 3 is a cross-sectional view of a thin film transistor array panel according to an exemplary embodiment of the present invention.

Referring to FIG. 3, a gate line (not shown) and a gate electrode 124 protruded from the gate line are formed on a substrate 110, which may be made of glass or plastic.

Figure 4:
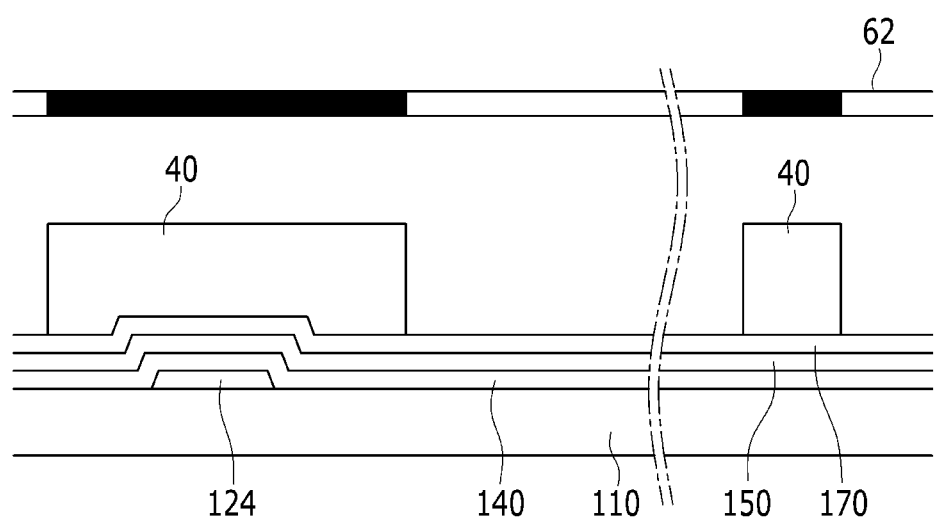
FIG. 4 is a cross-sectional view of a thin film transistor array panel according to an exemplary embodiment of the present invention.

As shown in FIG. 4, a gate insulating layer 140 is formed on the whole surface of the substrate 110 including the gate line and the gate electrode 124. The gate insulating layer 140 may be made of an insulating material, such as silicon oxide or silicon nitride.

The gate insulating layer 140 may be formed of a single layer or a multilayer. If the gate insulating layer 140 is formed in a multilayer composition, the silicon oxide may be firstly deposited and the silicon nitride may then deposited. Alternatively, the silicon nitride may be firstly deposited and the silicon oxide may be then deposited to form the gate insulating layer 140. If the oxide semiconductor is deposited on the gate insulating layer 140, the gate insulating layer 140 may be formed according to the latter method. The gate electrode 124 may contact the silicon nitride, and the oxide semiconductor may contact the silicon oxide such that the likelihood of the neighboring layers affecting each other may be reduced.

A semiconductor material 150 is deposited on the gate insulating layer 140, and a metal material 170 is deposited on the semiconductor material 150. At this time, the semiconductor material 150 and the metal material 170 may be continuously deposited.

The semiconductor material 150 may be made of an amorphous silicon semiconductor, a polysilicon semiconductor, or an oxide semiconductor. If the semiconductor material 150 is made of the oxide semiconductor, a material such as indium-gallium-zinc oxide (IGZO), zinc-tin oxide (ZTO), and indium-tin oxide (IZO) may be used.

The metal material 170 may be made of a single layer or a multilayer. If the metal material 170 has a dual layer composition including a lower layer and an upper layer, the lower layer may be made of titanium (Ti) and the upper layer may be made of copper (Cu). Also, the lower layer may be made of a copper-manganese (Cu—Mn) alloy, and the upper layer may be made of copper (Cu).

A photosensitive material is coated on the metal material 170 to form a first photosensitive film. The first photosensitive film may be processed by using a first mask 62 to form a first photosensitive film pattern 40. In an example, the first photosensitive film may be processed by an etching operation.

Figure 5:
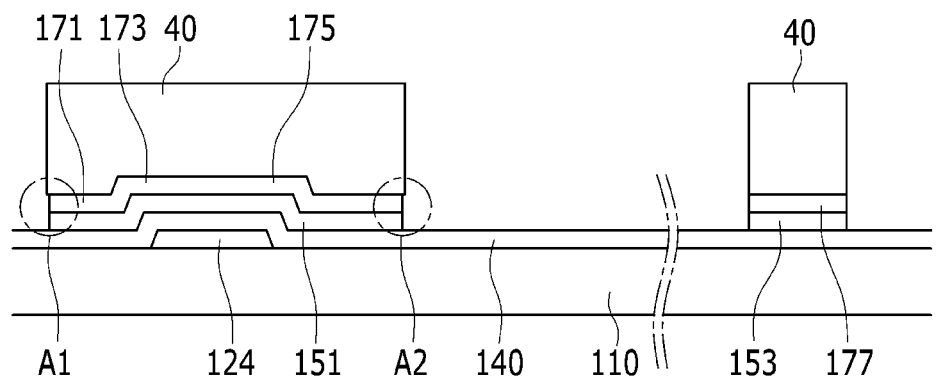
FIG. 5 is a cross-sectional view of a thin film transistor array panel according to an exemplary embodiment of the present invention.
Figure 6A:
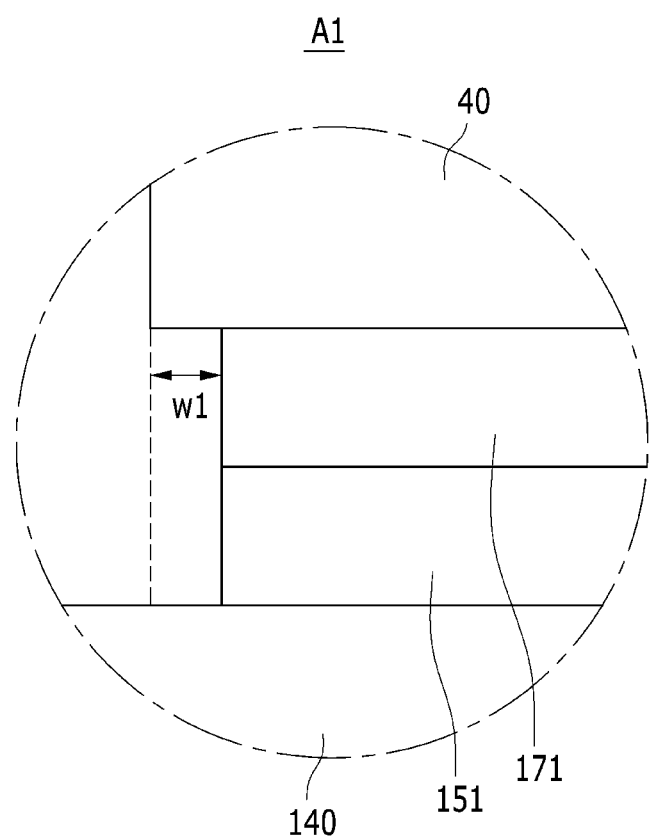
FIG. 6A and FIG. 6B are enlarged cross-sectional views showing regions A1 and A2 of the thin film transistor array panel shown in FIG. 5.
Figure 6B:
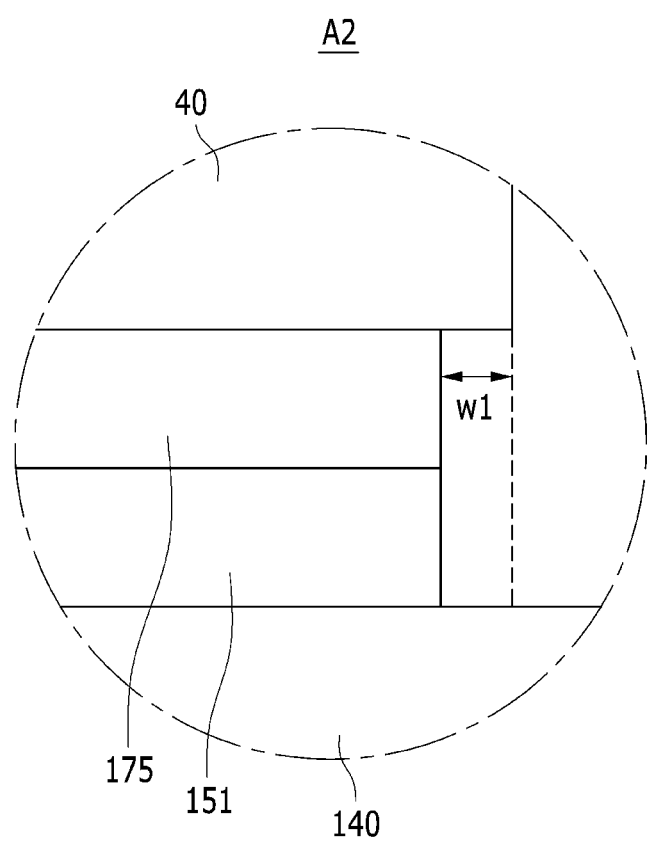

As shown in FIG. 5 in comparison to FIG. 4, the semiconductor material 150 of FIG. 4 and the metal material 170 of FIG. 4 are etched by using the first photosensitive film pattern 40 to form a data line 171, the source electrode 173, and the drain electrode 175. At this point, the drain electrode 175 and the source electrode 173 are protruded from the data line 171 on the gate electrode 124 and may be integrally formed with each other. Also, a semiconductor layer 151 positioned under a metal layer including the data line 171, the source electrode 173, and the drain electrode 175, is formed.

The semiconductor layer 151 has the same boundary as the layer including the data line 171, the source electrode 173, and the drain electrode 175. That is, the semiconductor material 150 and the metal material 170 are simultaneously patterned by using the first mask 62 to provide the semiconductor 151 and the layer including data line 171, the source electrode 173, and the drain electrode 175 to have the same boundaries.

The data line 171 may cross the gate line 121, and a data pad electrode 177 having a wider width than the width of the data line 171 may be formed at the end of the data line 171. The data pad electrode 177 is extended from the data line 171 and is formed with the same material as the data line 171.

A semiconductor pattern 153 made with the same material as the semiconductor layer 151 may be formed under the data pad electrode 177. The semiconductor pattern 153 has a wider width than the data line 171 and has the same width as the data pad electrode 177. The semiconductor pattern 153 overlaps to have the same boundary as the data pad electrode 177.

The semiconductor material 150 and the metal material 170 may be etched by a wet etching method. If the wet etching method is used, isotropic etching may be performed. During the etching process, the top surface of select portions of the semiconductor layer 150 and the metal material 170 may be etched to expose the gate insulating layer 140. Accordingly, side surfaces of select portions of the metal material 170 and the semiconductor material 150 positioned under the first photosensitive film pattern 40 may be etched as well to reveal a side surface A1 and a side surface A2.

Accordingly, as shown in FIG. 6A and FIG. 6B, the data line 171 and the drain electrode 175 have a boundary inside the boundary of the first photosensitive film pattern 40 by the first width w1, which may be referred to as a first skew. Also, although not shown, the source electrode 173 has a boundary inside the boundary of the first photosensitive film pattern 40 by the first width w1.

The semiconductor material 150 and the metal material 170 may be etched by the first etchant. The first etchant may be made of a material that is capable of etching the semiconductor material 150 and the metal material 170. Accordingly, the semiconductor material 150 and the metal material 170 may be simultaneously etched.

Once the semiconductor material 150 and the metal material 170 have been etched, the first photosensitive film pattern 40 may be removed. In an example, the first photosensitive film pattern 40 may be removed by an etching process.

Figure 7:
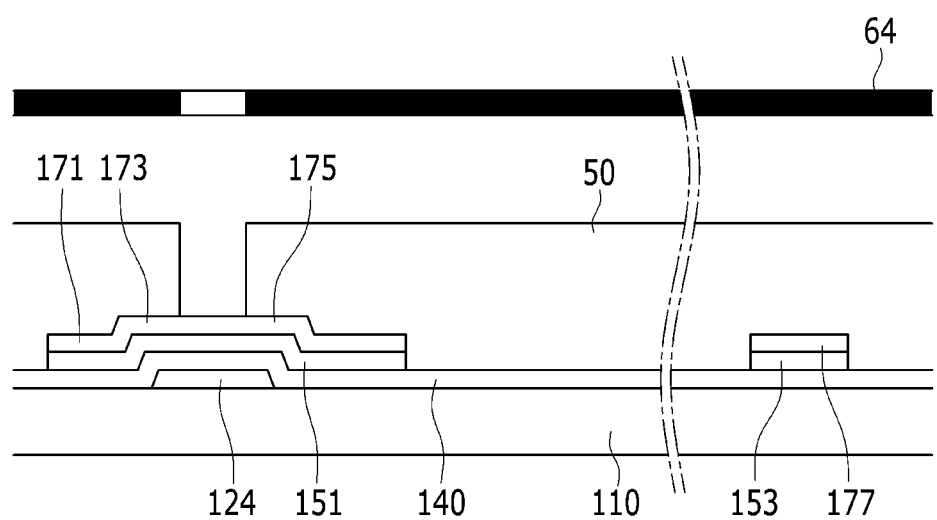
FIG. 7 is a cross-sectional view of a thin film transistor array panel according to an exemplary embodiment of the present invention.

As shown in FIG. 7, after the first photosensitive film pattern 40 is removed, a photosensitive material is coated on the whole surface of the substrate 110 including the data line 171, the source electrode 173, and the drain electrode 175 to form a second photosensitive film. The second photosensitive film may be processed using a second mask 64 to form a second photosensitive film pattern 50. In an example, the second photosensitive film may be processed using an etching operation. Based on a type of the film, positive or negative, the area exposed to light may be either removed or remain during the etching process.

Figure 8:
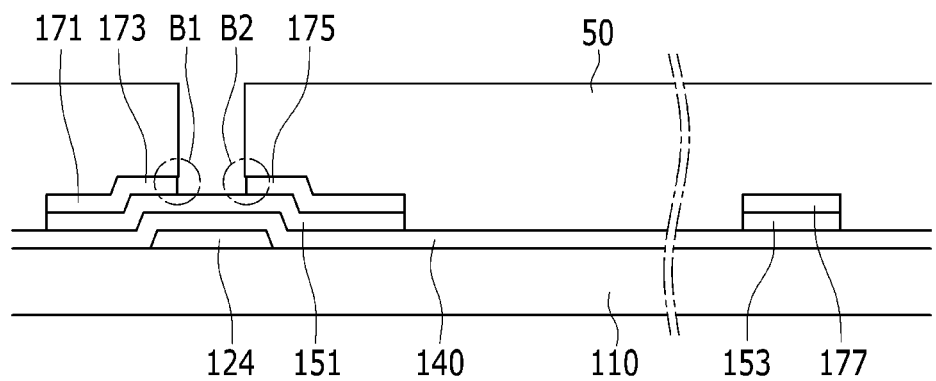
FIG. 8 is a cross-sectional view of a thin film transistor array panel according to an exemplary embodiment of the present invention.
Figure 9A:
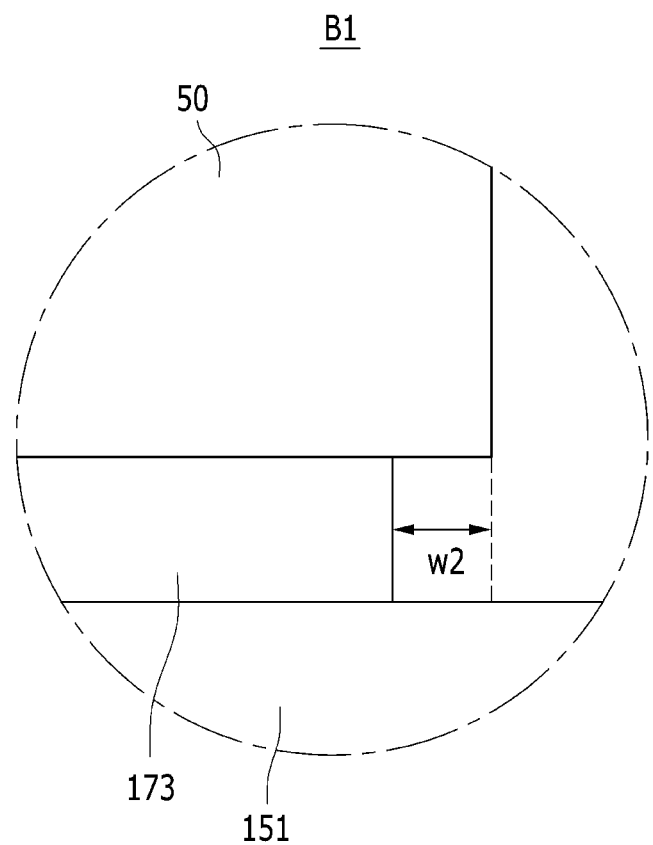
FIG. 9A and FIG. 9B are enlarged cross-sectional views showing regions B1 and B2 of the thin film transistor array panel shown in FIG. 8.
Figure 9B:
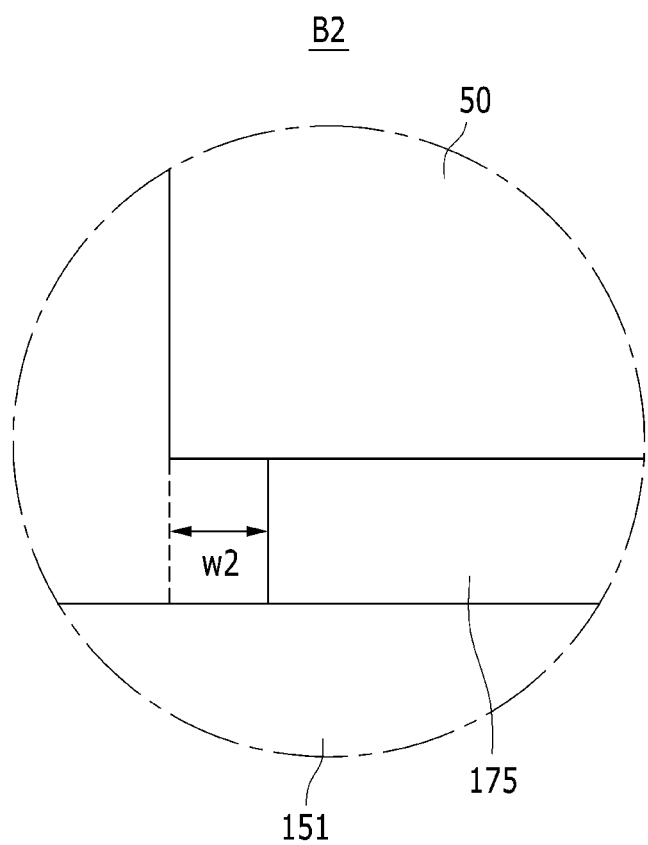

As shown in FIG. 8, a portion of the source electrode 173 and the drain electrode 175 that were integrally formed with the each other are etched by using the second photosensitive film pattern 50 to divide the source electrode 173 and the drain electrode 175. A channel of the thin film transistor is formed in a portion of the semiconductor layer 151 disposed between the source electrode 173 and the drain electrode 175. Accordingly, the semiconductor layer 151 has the same boundary as the data line 171, the source electrode 173, and the drain electrode 175 except for the channel portion. In other words, the semiconductor layer 151 may have the same length as the data line 171, the source electrode 173, the drain electrode 175 and the channel portion combined.

The source electrode 173 and the drain electrode 175 may be formed with an isotropic etching structure through a wet etching method. Accordingly, a side surface B1 and side surface B2 of the source electrode 173 and the drain electrode 175 positioned under the second photosensitive film pattern 50 may be etched.

Accordingly, as shown in FIG. 9A and FIG. 9B, the source electrode 173 and the drain electrode 175 have the boundary positioned inside the boundary of the second photosensitive film pattern 50 by the second width w2, which may be referred to as a second skew.

The source electrode 173 and the drain electrode 175 may be etched by a second etchant. The second etchant may be made of a material that is capable of etching the source electrode 173 and the drain electrode 175, while not etching the semiconductor layer 151.

According to the manufacturing method of the thin film transistor array panel, the first photosensitive film pattern 40 may be formed. Further, the data line 171, the source electrode 173, the drain electrode 175, and the semiconductor layer 151 may be formed by using the first mask 62. Also, the second photosensitive film pattern 50 and the corresponding channel portion may be formed by using the second mask 64.

According to a conventional process of manufacturing the thin film transistor array panel, a data line, a source electrode, a drain electrode, a semiconductor layer, and a channel portion may be formed together by using one mask. For this, a slit mask or a half-tone mask may be used. Further, an etch-back process may be used.

Compared to this, exemplary embodiments of the invention provide a process of manufacturing the thin film transistor array panel, which may not use a specific mask, such as the slit mask or the half-tone mask, so that corresponding cost may be reduced. Also, the etch-back process may not be used, such that a side portion of the metal layer may not form a skew therein. Accordingly, skew may be avoided and the semiconductor layer does not have the portion protruding beyond the boundary of the metal layer including the data line 171, the source electrode 173, and the drain electrode 175. Also, the metal layer including the data line 171, the source electrode 173, and the drain electrode 175 except for the channel portion are covered by the second photosensitive film pattern 50 while forming the channel portion such that the side surfaces of the metal layer are not etched to form a skew, and thereby the skew and the under-cut are not generated.

Also, according to the conventional process of manufacturing the thin film transistor array panel, the semiconductor layer is formed by using one mask, and the metal layer including the data line, the source electrode, and the drain electrode are formed by using another mask. At this time, the metal material forming the data line, the source electrode, and the drain electrode may be etched to form the data line, the source electrode, and the drain electrode. The semiconductor layer may be etched by using the etchant that is not capable of etching them. That is, the same etchant as the second etching in an exemplary embodiment of the present invention is used.

Referring to FIG. 6A, FIG. 6B, FIG. 9A, and FIG. 9B, it may be confirmed that the size of the skew generated if using the first etchant corresponds to the first width w1, and the size of the skew generated if using the second etchant corresponds to the second width w2. The second width w2 may be larger than the first width w1. That is, the skew generated using the second etchant compared to the first etchant may be larger.

In the manufacturing process of the thin film transistor array panel according to an exemplary embodiment of the present invention, the first etchant may be used if forming the data line 171, the source electrode 173, and the drain electrode 175 except for the channel portion, and thereby the generation of the skew and the under-cut may be reduced.

Figure 10:
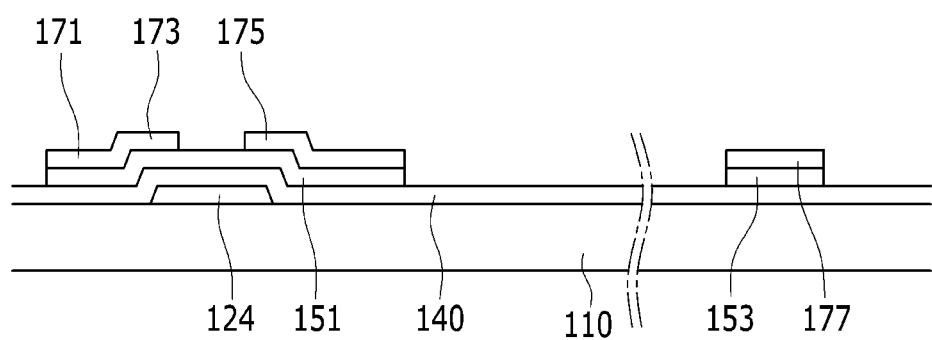
FIG. 10 is a cross-sectional view of a thin film transistor array panel according to an exemplary embodiment of the present invention.

As shown in FIG. 10, the second photosensitive film pattern 50 is removed. The gate electrode 124, the semiconductor layer 151, the source electrode 173, and the drain electrode 175 form one thin film transistor.

Figure 11:
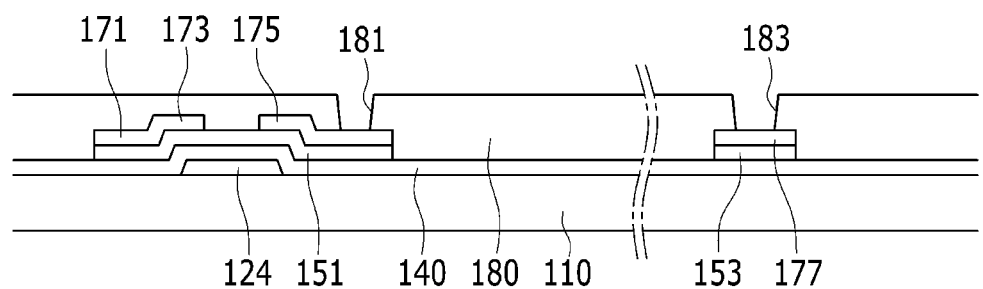
FIG. 11 is a cross-sectional view of a thin film transistor array panel according to an exemplary embodiment of the present invention.

As shown in FIG. 11, a passivation layer 180 is formed on the whole surface of the substrate 110 including the data line 171, the source electrode 173, and the drain electrode 175. The passivation layer 180 may be made of the inorganic insulating material or the organic insulating material, or the dual layer of the inorganic insulating material and the organic insulating material.

Next, the first contact hole 181 exposing a portion of the drain electrode 175 is formed in the passivation layer 180. Also, the second contact hole 183 exposing a portion of the data pad electrode 177 may be formed in the passivation layer 180.

Figure 12:
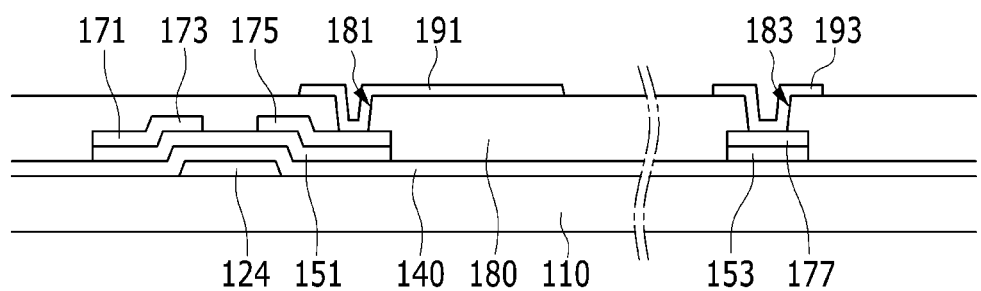
FIG. 12 is a cross-sectional view of a thin film transistor array panel according to an exemplary embodiment of the present invention.

As shown in FIG. 12, a pixel electrode 191 connected to the drain electrode 175 through the first contact hole 181 is formed. Also, a connection electrode 193 connected to the data pad electrode 177 through the second contact hole 183 may be formed. The pixel electrode 191 and the connection electrode 193 may be formed with the same material and the same layer. For example, they may be formed with the transparent metal material such as indium-tin oxide (ITO) and indium-zinc oxide (IZO).

In the manufacturing method for the thin film transistor array panel according to an exemplary embodiment of the present invention, the semiconductor material 150 may be made of the oxide semiconductor, and the metal material 170 may be made of titanium and copper, but is not limited thereto. To avoid incurring skews and under-cuts during the wet etching process, the described materials may be used. However, different materials than the above materials that may be capable of being etched by using the wet etching may be used.

For example, the metal material 170 may be made to have a triple layer composition including a lower layer, a middle layer, and an upper layer. The lower layer and the upper layer may be made of molybdenum (Mo), and the middle layer may be made of aluminum (Al). Also, the semiconductor material 150 may be made of amorphous silicon or crystalline silicon.

According to an exemplary method for manufacturing the thin film transistor array panel, the semiconductor material 150 and the metal material 170 may be simultaneously etched by using the first mask 62 to form the semiconductor layer 151, the data line 171, the source electrode 173, and the drain electrode 175. Further, the source electrode 173 and the drain electrode 175 may be separated by using the second mask 64.

Figure 13:
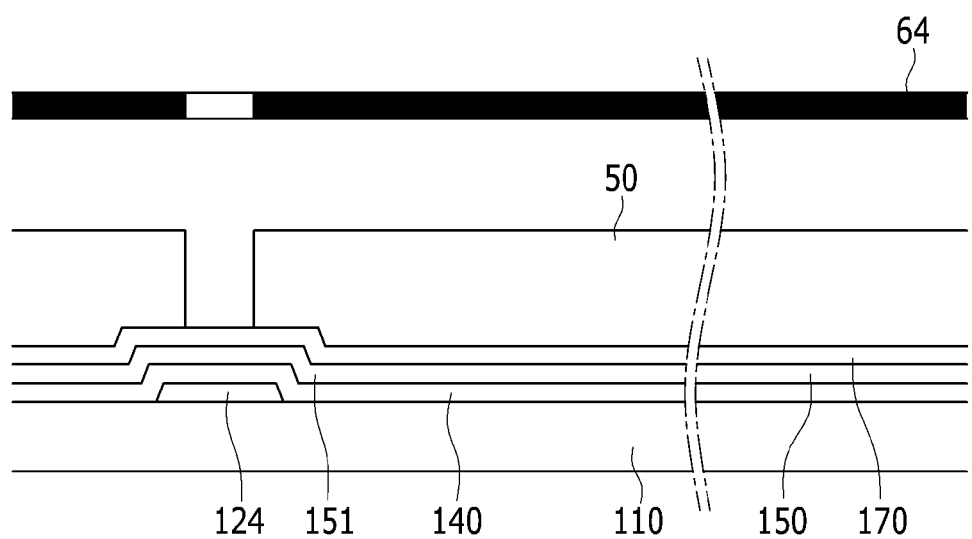
FIG. 13 is a cross sectional view of a thin film transistor array panel according to an exemplary embodiment of the present invention.
Figure 14:
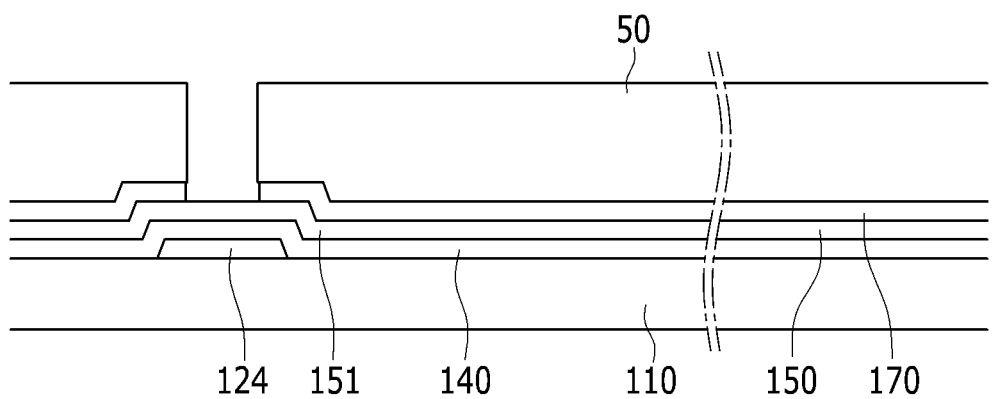
FIG. 14 is a cross sectional view of a thin film transistor array panel according to an exemplary embodiment of the present invention.
Figure 15:
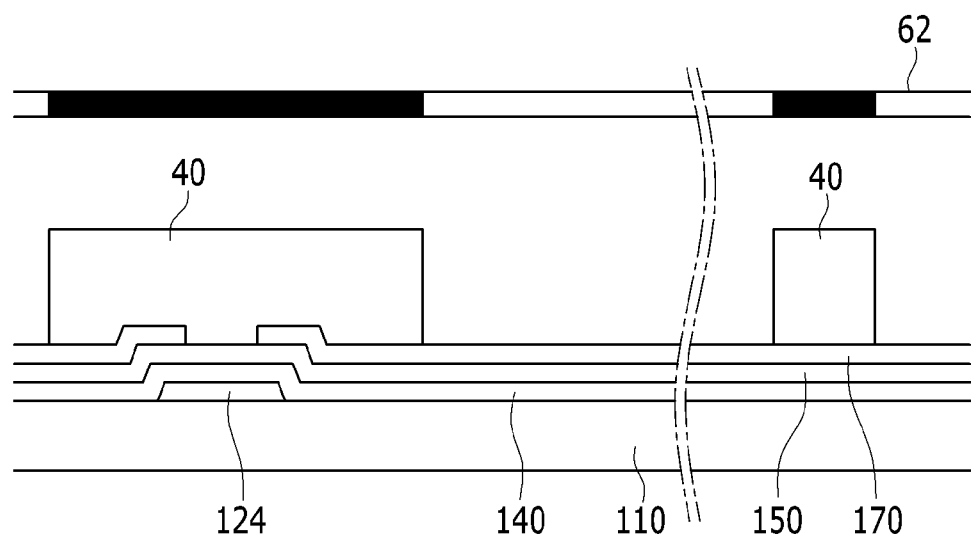
FIG. 15 is a cross sectional view of a thin film transistor array panel according to an exemplary embodiment of the present invention.
Figure 16:
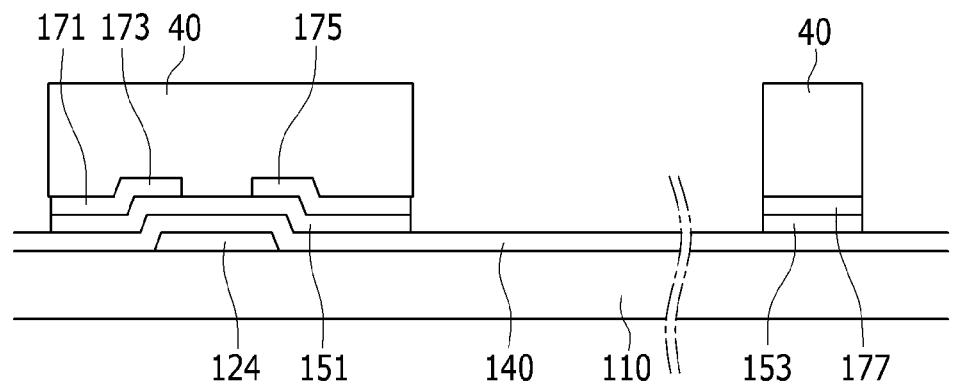
FIG. 16 is a cross sectional view of a thin film transistor array panel according to an exemplary embodiment of the present invention.

Exemplary embodiments of the present invention are not limited to a particular configuration or formed in a particular sequence. The sequence in which various layers are formed to manufacture the thin film transistor array panel may be reversed. That is, the metal material 170 may be etched by the same mask as the second mask 64 to separate the metal material 170 with a predetermined interval on the gate electrode 124 referring to FIG. 13 and FIG. 14. Next, the semiconductor material 150 and the metal material 170 may be simultaneously etched by using the same mask as the first mask 62 to form the semiconductor layer 151, the data line 171, the source electrode 173, and the drain electrode 175 referring to FIG. 15 and FIG. 16.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A method for manufacturing a thin film transistor array panel, comprising:
   forming a gate line and a gate electrode protruding from the gate line on a substrate;
   forming a gate insulating layer on the gate line and the gate electrode;
   depositing a semiconductor material on the gate insulating layer;
   depositing a metal material directly on the semiconductor material;
   performing a first etching operation on the semiconductor material and the metal material using a first mask to form a semiconductor layer and a metal layer, the metal layer comprising a data line, a source electrode, and a drain electrode,
   wherein the drain electrode protrudes from the data line, the source electrode is formed on the gate electrode, the source electrode and the drain electrode have an integral shape, and the semiconductor layer is positioned under the metal layer;
   performing a second etching operation on the metal layer using a second mask to divide the source electrode and the drain electrode; and
   forming a pixel electrode connected to the drain electrode, wherein performing the first etching operation comprises:

forming a first photosensitive film on the metal material;
processing the first photosensitive film using the first mask to form a first photosensitive film pattern; and
forming the data line, the source electrode, and the drain electrode using the first photosensitive film pattern, wherein performing the second etching operation comprises:
forming a second photosensitive film directly on the data line, the source electrode, and the drain electrode;
processing the second photosensitive film using the second mask to form a second photosensitive film pattern; and
dividing the source electrode and the drain electrode using the second photosensitive film pattern so as to form a channel in the semiconductor layer,
wherein the second photosensitive film pattern covers an upper portion of the source electrode and the drain electrode without covering the channel, and covers a side portion of the source electrode, the drain electrode, and the semiconductor layer,
wherein only the metal layer is etched during the second etching operation,
wherein the semiconductor material comprises an oxide semiconductor,
wherein the gate insulating layer has a multilayer structure comprising a silicon oxide layer and a silicon nitride layer, the gate electrode contacting the silicon nitride layer, and the semiconductor layer contacting the silicon oxide layer,
wherein the semiconductor layer consists of a single material.

2. The method of claim 1, wherein in performing the second etching operation,
a channel portion is formed between the source electrode and the drain electrode, and
the semiconductor layer overlaps the data line, the source electrode, and the drain electrode to have the same boundary except for the channel portion.

3. The method of claim 1, wherein in performing the first etching operation,
the semiconductor material and the metal material are etched using a wet etching method, and
wherein in performing the second etching operation,
the source electrode and the drain electrode are etched by the wet etching method.

4. The method of claim 3, wherein in performing the first etching operation,
the semiconductor material and the metal material are etched by a first etchant, and
the first etchant comprises a material for etching the semiconductor material and the metal material.

5. The method of claim 4, wherein in performing the second etching operation,
the source electrode and the drain electrode are etched by a second etchant, and
the second etchant comprises a material for etching the source electrode and the drain electrode while not etching the semiconductor layer.

6. The method of claim 1, wherein
the oxide semiconductor comprises at least one of indium-gallium-zinc oxide (IGZO), zinc-tin oxide (ZTO), and indium-tin oxide (IZO).

7. The method of claim 1, wherein
the metal layer has a dual layer composition comprising a first layer and a second layer,
the first layer comprising titanium, and
the second layer comprising copper.

8. The method of claim 1, wherein
the metal layer has a dual layer composition comprising a first layer and a second layer,
the first layer comprising a copper-manganese (Cu—Mn) alloy, and
the second layer comprising copper.

9. The method of claim 1, wherein
the metal layer has a triple layer composition comprising a first layer, a second layer, and a third layer,
the first layer and the third layer comprising molybdenum, and
the second layer comprising aluminum.

10. The method of claim 1, wherein the metal layer consists of a single material.

11. A method for manufacturing a thin film transistor array panel, comprising:
forming a gate line and a gate electrode protruding from the gate line on a substrate;
forming a gate insulating layer on the gate line and the gate electrode and entirely covering the substrate;
depositing sequentially a semiconductor material and a metal material on the gate insulating layer;
executing a first etching operation for etching the metal material using a first mask to remove a portion of the metal material overlapping the gate electrode;
executing a second etching operation, after executing the first etching operation, for etching the semiconductor material and the metal material using a second mask to form a semiconductor layer and a metal layer, the metal layer comprising a data line, a source electrode overlapping the gate electrode and protruding from the data line, and a drain electrode,
wherein the drain electrode is spaced apart from the source electrode, and the semiconductor layer is positioned under the metal layer; and
forming a pixel electrode connected to the drain electrode,
wherein executing the first etching operation comprises:
forming a first photosensitive film on a portion of the metal material that will form the data line, the source electrode, and the drain electrode;
processing the first photosensitive film using the first mask to form a first photosensitive film pattern; and
dividing a portion of the metal material that will form the source electrode and a portion of the metal material that will form the drain electrode using the first photosensitive film pattern so as to form a channel in the semiconductor layer, wherein the first photosensitive film pattern covers an upper portion of the portion of the metal material that will form the source electrode and the portion of the metal material that will form the drain electrode without covering the channel,
wherein only the metal material is etched during the first etching operation,
wherein the semiconductor material comprises an oxide semiconductor,
wherein the gate insulating layer has a multilayer structure comprising a silicon oxide layer and a silicon nitride layer, the gate electrode contacting the silicon nitride layer, and the semiconductor layer contacting the silicon oxide layer, and
wherein the semiconductor layer consists of a single material.

12. The method of claim 11, wherein the metal layer consists of a single material.

13. A method for manufacturing a thin film transistor array panel, comprising:
- forming a gate line and a gate electrode protruding from the gate line on a substrate;
- forming a gate insulating layer on the gate line and the gate electrode;
- depositing a semiconductor material on the gate insulating layer;
- depositing a metal material directly on the semiconductor material;
- forming a first photosensitive film pattern, using a first mask, on the metal material and the semiconductor material;
- etching the semiconductor material and the metal material, having the first photosensitive film pattern disposed thereon, to form a semiconductor layer and a metal layer, the metal layer comprising a data line, a source electrode, and a drain electrode, the source electrode being integrally formed with the drain electrode;
- removing the first photosensitive film pattern;
- forming a second photosensitive film pattern, using a second mask, directly on the metal layer;
- etching the metal layer, having the second photosensitive film pattern disposed thereon, thereby separating the source electrode and the drain electrode, without etching the semiconductor material;
- removing the second photosensitive film pattern;
- forming a passivation layer on the source electrode and the drain electrode; and
- forming a pixel electrode, the pixel electrode being connected to the drain electrode via a contact hole in the passivation layer,
- wherein the semiconductor material comprises an oxide semiconductor,
- wherein the gate insulating layer has a multilayer structure comprising a silicon oxide layer and a silicon nitride layer, the gate electrode contacting the silicon nitride layer, and the semiconductor layer contacting the silicon oxide layer, and
- wherein the semiconductor layer consists of a single material.

14. The method of claim 13, wherein forming the second photosensitive film pattern comprises covering side surfaces of the source electrode and the drain electrode such that the side surfaces of the source electrode and the drain electrode are not etched during the etching of the metal layer.

15. The method of claim 14, wherein when separating the source electrode and the drain electrode, the semiconductor layer is not etched.

16. The method of claim 15, wherein etching the semiconductor material and the metal material comprises wet etching using a first etchant, and etching the metal layer comprises wet etching using a second etchant different from the first etchant.

17. The method of claim 13, wherein the metal layer consists of a single material.

* * * * *